United States Patent [19]

Diepers

[11] 4,099,986
[45] Jul. 11, 1978

[54] SOLAR CELL COMPRISING SEMICONDUCTIVE WHISKERS

[75] Inventor: Heinrich Diepers, Erlangen, Fed. Rep. of Germany

[73] Assignee: Siemens Aktiengesellschaft, Munich, Fed. Rep. of Germany

[21] Appl. No.: 827,026

[22] Filed: Aug. 23, 1977

[30] Foreign Application Priority Data

Sep. 3, 1976 [DE] Fed. Rep. of Germany ....... 2639841

[51] Int. Cl.² .......................................... H01L 31/06
[52] U.S. Cl. ......................... 136/89 TF; 136/89 SJ; 136/89 SG; 136/89 CC; 148/171; 148/175; 156/609; 357/20; 357/30; 357/55
[58] Field of Search .......... 136/89 TF, 89 SJ, 89 SG, 136/89 CC; 357/20, 30, 55; 250/211 R, 211 J, 212

[56] References Cited

U.S. PATENT DOCUMENTS

| 3,201,665 | 8/1965 | Venables | 317/235 |
|---|---|---|---|
| 3,233,111 | 2/1966 | Pike | 250/211 |
| 3,278,337 | 10/1966 | Gault | 136/89 |
| 3,418,170 | 12/1968 | Amsterdam et al. | 136/89 |
| 3,984,256 | 10/1976 | Fletcher et al. | 136/89 |
| 3,985,579 | 10/1976 | Rahilly | 136/89 |

OTHER PUBLICATIONS

P. H. Fang et al., "Polycrystalline Silicon Films on Aluminum Sheets for Solar Cell Application", *Appl. Phys. Lett.*, vol. 25, pp. 583–584 (1974).

*Primary Examiner*—Aaron Weisstuch
*Attorney, Agent, or Firm*—Kenyon & Kenyon, Reilly, Carr & Chapin

[57] ABSTRACT

A solar cell with semiconductor body consisting of single crystal semiconductor whiskers which are grown on a substrate surface permitting relatively inexpensive manufacture and high efficiency of the solar cell is disclosed.

6 Claims, 1 Drawing Figure

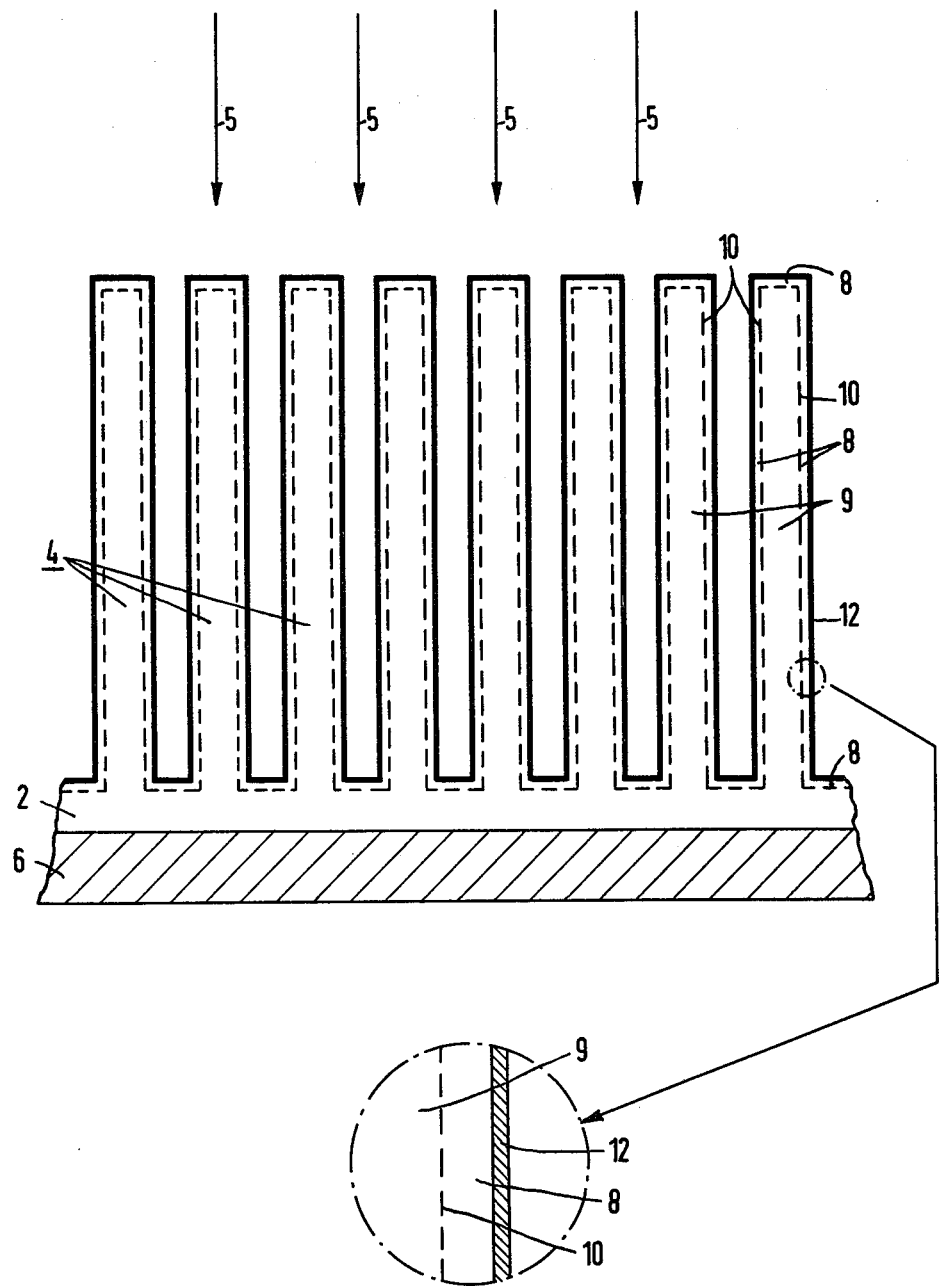

SOLAR CELL COMPRISING SEMICONDUCTIVE WHISKERS

BACKGROUND OF THE INVENTION

The invention relates to solar cells in general and more particularly to an improved solar cell and method of manufacture therefor.

Solar cells having zones of opposite doping forming a p-n junction in their semiconductor body, which zones are each provided with an electrode, are known.

Solar cells are electronic semiconductor components, by means of which sunlight can be converted into electric energy. The semiconductor body can consist, for instance, of silicon or a III-V compound such as gallium arsenide and is provided on its front side facing the radiation source with a p-n junction of large area by means of diffusion. Planar metal contacts on the back side and thin metallic contact strips on the front side are used as electrodes for collecting the current generated in such a semiconductor crystal. At the p-n junction a diffusion voltage, the magnitude of which is determined by the impurity concentration in the adjacent zones, is generated at thermal equilibrium. It forms an internal field over the space charge zone of the boundary layer. If light quanta with sufficiently large energy now enter such a semiconductor, additional pairs of charge carriers are produced on both sides of the p-n junction in excess over the thermal equilibrium. The charge carriers produced then move toward the p-n junction and are separated in the electric field of the latter. This separation results in a reduction of the internal potential. The difference from the potential of the thermal equilibrium appears as a photo voltage, the equalization of the charges then taking place in an external load circuit connected to the semiconductor crystal, giving off electric energy.

As is well known, solar cells are designed with a view toward permitting as many photons as possible to penetrate into the semiconductor and thus the number of charge carriers reaching the p-n junction as well as the available power become as large as possible. The zone of the semiconductor body facing the light source, which is in general of the n-conduction type which deteriorates less than a p-conduction zone, is therefore chosen as thin as possible, so that a high percentage of the light absorbed in the very thin semiconductor layer contributes to the energy conversion. The conversion length is then approximately equal to the diffusion length. In addition, the layer resistance of this n-conduction zone is chosen small lest the efficiency of the solar cell be reduced by a excessively large series or internal resistance. In addition, it is advantageous to choose a starting material with a resistivity of between 1 and 10 ohm-cm. The cells made of such materials are degraded but little if exposed to corpuscular radiation. Furthermore, the life of the minority carriers and, therefore, the diffusion length is sufficient large so that a considerable portion of the light quanta which are absorbed further inside on the side of the p-n junction facing away from the direction of the incident light, generate charge carriers which still can reach the p-n junction.

A large portion of the light incident on the semiconductor surface of a solar cell is reflected; in the case of a plane silicon surface, this portion can be as much as 32%. The known solar cells are therefore generally provided with a layer of suitable thickness of a material with a matched index of refraction, in order to limit the reflection losses to a negligible amount (German Offenlengungsschrift No. 1 934 751).

Solar cells generally contain a plane semiconductor body several hundred $\mu m$ thick, for instance, 350 $\mu m$ thick, of single crystal, p-conduction silicon, into the top side of which a thin n-conduction zone with a small thickness of, for instance, 0.3 $\mu m$, is diffused. The manufacture of such silicon sheets, however, is very elaborate and expensive, so that the production of energy with such cells is substantially more expensive than other energy production methods.

SUMMARY OF THE INVENTION

It is therefore an object of the present invention to provide a solar cell which can be produced less expensively and the efficiency of which is further increased over that of the known solar cells.

This problem is solved for a solar cell of the type mentioned at the outset by the provision that its semiconductor body consists of semiconductor whiskers grown on a substrate surface.

A whisker is understood here to be a filamentary crystal of high strength, several $\mu m$ in diameter and with lengths of up to several cm. As a rule, its structure is that of a single crystal with a nearly ideal lattice.

A substrate is understood here to be a material which at least favors the growth or germination of whiskers and on the surface of which the whiskers can be grown in a reaction chamber. Although the substrate may be present in particle form, e.g., as dust, whisker fragments or other materials, preferred substrates are heat resistant materials such as aluminum oxide or silicate, which are commonly used in sheet or tube form. Details on whisker growing methods may be found, for instance, in the book "Whisker Technology", New York 1970, edited by A. P. Levitt, published by Wiley-Inter-Science.

The advantages of the solar cell according to the present invention are in particular that the whiskers provided for this cell are single crystals and therefore make possible a high efficiency of the cell. The large surface to volume ratio of the whiskers, which leads to a p-n junction in the cell of particularly large surface, results in a large increase of the quantum yield as compared to a plane surface. In addition, such whiskers can absorb the radiation almost without reflection. An antireflection layer as in the known solar cells is therefore not necessary. Since the absorption depth can be chosen approximately equal to the diffusion length of the charge carrier pairs in the whisker material, savings of material results while the quantum yield and the efficiency are increased. In addition, the solar cells according to the present invention can be produced by applying all the processes required therefor in series. Such production is relatively cost effective.

In the known solar cells, finger contacts, which leave an area as large as possible free for the passage of light, are used as electrodes on the light side of the semiconductor body U.S. Pat. No. 3,772,770. It is advantageous not to use such contacts for the solar cell according to the present invention, as it is not possible to cover the entire surface of all whiskers with these contacts. Therefore in accordance with a further embodiment of the solar cell according to the present invention, the surfaces of the semiconductor whiskers are coated with a layer of a transparent, electrically conductive material. Suitable materials are, for instance, tin oxide doped with antimony $SnO_2(Sb)$ or indium oxide doped with tin $In_2O_3(Sn)$. Their transparency in the visible range of the spectrum is better than 80%. Since no antireflection layers are required with the whiskers, the application of such transparent layers is possible. The whiskers can be coated with these layers at least on most of the surface, so that a correspondingly large percentage of the charge carriers getting to the surface is collected.

These light transparent, electrically conducting layers, which serve as one of the two electrodes of the solar cell, can be applied advantageously by cathode sputtering, vapor deposition or ion plating to the surfaces of the semiconductor whiskers. With these techniques, a relatively uniform layer thickness can be achieved on the entire whisker surface, and particualrly so at the tips of the whiskers.

According to a further embodiment of the solar cell of the present invention, the substrate and/or a carrier to which the substrate is applied, can advantageously consist of a material of high electric conductivity. The substrate or the carrier can then serve at the same time as the electrode on the side of the solar cell facing away from the radiation.

It is further of advantage if, for solar cells with silicon semiconductor whiskers, polycrystalline silicon is provided as the substrate. On this relatively inexpensive material, particularly, perfect single-crystal whiskers can be grown.

For growing the semiconductor whiskers of a solar cell according to the present invention, the so-called vapor-liquid solid mechanism (VLS meachanism) can advantageously be used, which is known form the journal "Transactions of the Metallurgical Society of AIME", vol. 233, June 1965, pages 1053 to 1064. According to this crystal growing mechanism, the material to be crystallized is absorbed in a predetermined amount of a metal which is placed on the substrate and in which the material to be crystallized is soluble, and which is called the agent. At a suitable predetermined temperature, an alloy is formed during the precipitation with the material to be crysallized, which is saturated upon further precipitation of this material. Thus, supersaturation and precipitation of the material on the substrate comes about and, finally, growth of the whiskers with the liquid agent at the tips of the former.

The crystal growth which occurs is heavily anisotropic, i.e., it takes place nearly in a direction perpendicular to the substrate surface, since the absorption of the crystallizing material or its components takes place perferentially at the free surface of the liquid metal phase, while the precipitation from the liquid metal phase occurs only at the boundary surface between the drops and the substrate.

With the abovementioned method, a large area can advantageously be provided with whiskers. The manufacture of the solar cells according to the present invention is accordingly cost effective.

For making solar cells according to the present invention with semiconductor whiskers of a III–V compound or a ternary alloy with such a compound, it can be advantageous to use the first partner of this alloy or compound as the agent. Such compounds may be in particular the gallium compounds gallium arsenide (GaAs), gallium phosphide (GaP) or the ternary compound gallium arsenide phosphide ($Ga(As_{1-x}P_x)$) as well as the compounds indium phosphide (InP), cadmium telluride (CdTe), aluminum antimonide (AlSb) and cadmium sulfide (CdS). With crystals of these materials, solar cells having efficiencies which are higher than, for instance, the efficiency of the solar cells with silicon semiconductor whiskers can be manufactured, since the band gap of these materials is closer to the band gap of 1.5 eV, which is optimum for solar cells, than the band gap of silicon. Since the first compound partner of these compounds can act at the same time as the agent, the danger is small that foreign substances which lead to a reduction of the efficiency of the solar cells, will be incorporated into the whisker crystals.

BRIEF DESCRIPTION OF THE DRAWING

The single figure is a schematic presentation of a whisker solar cell according to the present invention.

DETAILED DESCRIPTION OF THE INVENTION

The solar cell, which is shown in a partial cross section in the figure, comprises a substrate surface 2, on which stand a multiplicity of single crystal semiconductor whiskers. In the figure, only eight whiskers 4 of equal size, arranged parallel side by side, are shown. Their heights and their diameters, which are, for instance, in the order of 100 μ or several hundred μ, may be different, however. In addition, the whiskers may have a cross section which varies over their height.

With respect to the incident sunlight radiation which is indicated by individual arrows 5, the solar cell is oriented so that its whiskers 4 are directed substantially against the direction of incidence of this radiation. Thus, the radiation can be absorbed almost completely by the whiskers with this structure.

Due to the spectral composition of the sunlight, the optimum band gap of the whisker material used for the solar cell, as measured in electron volts (eV), should be about 1.5 eV. The band gap of silicon is approximately 1.1 eV, so that the output voltage produced by a silicon solar cell is correspondingly small and the efficiency of the energy conversion of such a cell is in the order of about 11%. One will therefore attempt to use materials with larger band gaps for solar cells. Such materials are, for instance, certain semiconductive III–V compounds or also ternary alloys with such compounds. Thus, gallium arsenide, for instance, has a band gap of approximately 1.4 eV.

The whiskers 4 are advantagesouly grown on the substrate 2 in accordance with the known VLS mechanism. The corresponding method is applicable, for instance, to Si and particularly also to GaAs, GaP and $Ga(As_{1-x}P_x)$. While in the case of silicon, Au, Pt, Pd, Ni, Cu or Ag can be used as the agent, the Ga itself advantageously serves as the agent in the case of the gallium compounds mentioned. Other highly effective compounds with large band gaps are InP, CdTe, AlSb and CdS, to which the VLS method is likewise applicable. With these compounds also a foreign material agent is not necessary, so that the first compound partner can serve as the agent, i.e., In, Cd, Al or Cd, respectively. Also Ge whiskers can be grown by the known method, likewise using Au as the agent.

In the known VLS method, the growth conditions for the whiskers in a reaction chamber provided for this purpose are heavily dependent on the temperature of the substrate. A similarly strong influence is also exerted by the vapor deposition rate or the degree of supersaturation of the vapor in the reaction chamber. The whisker diameter depends substantilly on the particle size of the reagent material and the temperature. Thus, increasing temperatures lead to larger whisker diameters due to better wetting of the substrate surface. The agent material can be applied, for instance, through masks to specific points on the substrate surface or may also simply be vapor deposited on the substrate. During the vapor deposition or the heating of the substrate, small droplets then form on the substrate surface. The size of the droplets depends, for instance, on the layer thickness of the vapor deposited material.

With the known method, whisker densities of, say, $10^4$ cm$^2$ to $10^6$/cm$^2$ can be obtained. This corresponds to a mean whisker width of 100 to 10 $\mu$ if the arrangement is rectangular.

Any substance favoring whisker growth or whisker germination can be used as material for the substrate 2. Thus, single or also polycrystalline silicon substrate can be provided, for instance, for growing silicon whiskers. As is shown in the FIGURE, such electrically nonconducting substrates are advantageously placed on an electrically conducting carrier body 6, which acts at the same time as a elecrode. Advantageously, electrically conducting metal strips can also be provided as the substrate body and at the same time as the electrode. In the case of silicon whisker growing, such a strip can consist of carbon-free steel, for instance.

Doping of the whiskers grown by the VLS method can be carried out in accordance with known techniques. Thus, p-doping of silicon whiskers can take place after they are grown or, in some cases, also while they are being grown, with boron or aluminum. Subsequently the surface of this now p conducting whisker is given a doping of the opposite type for forming an n conducting border zone 8, for instance, by diffusing phosporus from the gaseous phase into the surface up to a depth which approximately corresponds to the diffusion length. The remaining p-conducting layers of the whiskers are designated 9 in the FIGURE. The p-n junction formed between the n- and p-conduction zones 8 and 9 is indicated in the figure by a dashed line 10. The position in depth of this p-n junction 10 can be adjusted in a manner known per se by the diffusion conditions, e.g., the diffusion time, the diffusion temperature or the gas flow.

Although n-doping of the border zone 8 near the surface and p-doping in the underlying zone 9 has been assumed, the doping of the two zones can just as well be arranged in the opposite manner, as is also known per se.

For developing an electrode facing the incident light for the solar cell according to the present invention, the surface of the whiskers 4 is coated with a layer 12 of light transparent material, which is at the same time electrically conductive. Advantageously, materials which absorb only a small fraction of the energy of the incident radiation are used. Such materials are, for instance, tin oxide doped with antimony SnO$_2$(Sb) or also indium oxide doped with tin, In$_2$O$_3$(Sn). Suitable techniques for applying these layers are, for instance, the so-called cathode sputtering method, which is described in the journal "Vakuumtechnik", vol. 24, Hg. 1975, no. 1, pages 1 to 11. The layers can also be vapor deposited or applied by means of ion plating, where the materials are vapor deposited, the vapor is partially ionized by a plasma discharge and the ionized portion in the vapor is precipitated electrostatically with the neutral vapor.

What is claimed is:

1. In a solar cell having a semiconductor body with zones of opposite doping forming a p-n junction and each zone provided with an electrode, the improvement comprising the semiconductor body consisting of a plurality of single crystal semiconductor whiskers grown on a substrate surface.

2. The improvement according to claim 1, and further including a layer of a transparent, electrically conductive material on the surfaces of the semiconductor whiskers to form electrodes thereon.

3. The improvement according to claim 2, wherein said conductive layer is selected from the group consisting of tin oxide doped with antimony and indium oxide doped with tin.

4. The improvement according to claim 1, wherein said whiskers are silicon semiconductor whiskers, and wherein said substrate is a silicon layer applied to a conductive carrier.

5. The improvement according to claim 1, wherein said substrate is polycrystalline silicon.

6. The improvement according to claim 1, wherein at least one of the substrate and a carrier to which the substrate is applied, consists of an electrically highly conductive material.

* * * * *